United States Patent
Li et al.

(10) Patent No.: US 11,715,517 B2
(45) Date of Patent: Aug. 1, 2023

(54) LINEAR PHASE CHANGE MEMORY

(71) Applicant: International Business Machines Corporation, Armonk, NY (US)

(72) Inventors: Ning Li, White Plains, NY (US);
Wanki Kim, Chappaqua, NY (US);
Devendra K Sadana, Pleasantville, NY (US)

(73) Assignee: International Business Machines Corporation, Armonk, NY (US)

(*) Notice: Subject to any disclaimer, the term of this patent is extended or adjusted under 35 U.S.C. 154(b) by 160 days.

(21) Appl. No.: 17/396,623

(22) Filed: Aug. 6, 2021

(65) Prior Publication Data
US 2023/0044919 A1   Feb. 9, 2023

(51) Int. Cl.
*G11C 11/00* (2006.01)
*G11C 13/00* (2006.01)
*G06N 3/063* (2023.01)

(52) U.S. Cl.
CPC .......... *G11C 13/0004* (2013.01); *G06N 3/063* (2013.01); *G11C 13/004* (2013.01); *G11C 13/0028* (2013.01)

(58) Field of Classification Search
CPC ............ G11C 13/0004; G11C 13/0028; G11C 13/004; G06N 3/063
(Continued)

(56) References Cited

U.S. PATENT DOCUMENTS 7,839,674 B2   11/2010  Lowrey et al.
8,120,943 B2   2/2012   Parkinson et al.
(Continued)

FOREIGN PATENT DOCUMENTS

WO   WO03058633 A1   7/2003

OTHER PUBLICATIONS

G. W. Burr et al., "Experimental demonstration and tolerancing of a large-scale neural network (165,000 synapses), using phase-change memory as the synaptic weight element," 2014 IEEE International Electron Devices Meeting, 2014, pp. 29.5.1-29.5.4, doi: 10.1109/IEDM.2014.7047135.
(Continued)

*Primary Examiner* — Vu A Le
(74) *Attorney, Agent, or Firm* — Daniel Morris; Otterstedt & Kammer PLLC

(57) ABSTRACT

A phase change (PCM) memory device that includes a PCM and a resistance-capacitance (RC) circuit. The PCM has one or more PCM properties, each PCM property has a plurality of PCM property states. As the PCM property states of a given property are Set or Reset, the PCM property states each produce an incremental change to a property level of the respective/associated PCM property, e.g., PCM conductance. The incremental changes to property level of the PCM memory device are in response to application of one or more of a pulse number of voltage pulses. The RC circuit produces a configuring current that flows through the PCM in response to one or more of the voltage pulses. The configuring current modifies one or more of the incremental changes to one or more of the property levels so that the property level changes linearly with respect to the pulse number. The PCM memory device has use in a synapse connector, e.g., in a memory array. The memory array can be used to store and/or read memory values associated with one or more of the property levels. The memory values can be used as weighting values in a neuromorphic computing application/system, like a neural network.

20 Claims, 8 Drawing Sheets

(58) Field of Classification Search
USPC .......................................................... 365/163
See application file for complete search history.

(56) References Cited

U.S. PATENT DOCUMENTS

| | | | |
|---|---|---|---|
| 8,379,439 | B2 | 2/2013 | Lowrey et al. |
| 9,437,293 | B1 | 9/2016 | Kripanidhi et al. |
| 9,710,747 | B2 | 7/2017 | Kang et al. |
| 9,947,400 | B2 | 4/2018 | Viviani |
| 2012/0084240 | A1 | 4/2012 | Esser et al. |
| 2012/0327709 | A1 | 12/2012 | Frey et al. |
| 2014/0214738 | A1 | 7/2014 | Pickett |
| 2016/0371582 | A1* | 12/2016 | Eleftheriou ............ G06N 3/049 |
| 2017/0109624 | A1 | 4/2017 | Park et al. |
| 2018/0300619 | A1 | 10/2018 | Lee |
| 2019/0244088 | A1* | 8/2019 | Yang ..................... G06N 3/063 |
| 2021/0125045 | A1 | 4/2021 | Jang et al. |
| 2021/0150317 | A1* | 5/2021 | Hou ........................ G06N 3/04 |

OTHER PUBLICATIONS

Athanasios Klouselogiou. Characterization and design of architectures for phase-change memories based on alternative-to-GST materials. Micro and nanotechnologies/Microelectronics. Universite' Grenoble Alpes, 2015. English. ,NNT: 2015Great128>. <tel-01278433>, Submitted on Feb. 24, 2016.

Luo Yandong et al: "Benchmark of Ferroelectric Transistor-Based Hybrid Precision Synapse for Neural Network Accelerator", IEEE Journal on Exploratory Solid-State Computational Devices and Circuits, IEEE, vol. 5, No. 2, Jun. 25, 2019 (Jun. 25, 2019), pp. 142-150, XP011769587, DOI: 10.1109/JXCDC.2019.2925061 [retrieved on Jan. 31, 2020] p. 144, col. 1, paragraph 3-paragraph 5: figure 1 p. 144-p. 146p figure 2.

PCT ISR and WO, mailded Nov. 16, 2022.

* cited by examiner

LINEAR PHASE CHANGE MEMORY

BACKGROUND

The present invention relates to phase change memory (PCM) devices and methods of operating these PCM devices. More specifically, the invention relates to PCMs with multiple property/resistive/conductive states and PCM arrays using these multiple state PCMs.

Some PCMs operate at two states, for example at a high or higher resistive state (HRS) and at a low or lower resistive state (ERS). Other PCMB can operate at multiple states, e.g., at device resistance values between the HRS and LRS. Different voltages applied to these devices can SET and RESET the device states.

In some devices, a dielectric, which is normally insulating, can be made (SET) to conduct (in a low resistance state (LRS)) through one or more filaments or conduction paths formed by application of a sufficiently high voltage. Thus, a voltage change can "RESET" the dielectric (e.g, break the filament/path resulting in a HRS) or "SET" (reform the filament/path resulting in a LRS) the dielectric. It is also possible to form/store intermediate states between LRS and HRS by changing the configuration of filaments via electrical bias or application of voltages to the dielectric in the PCM.

In multistate PCMs, an increment of resistance is added (e.g., an increment of conductance is removed) to (from) the total resistance (conductance), or other PCM property, of the PCM, referred to as the (total) PCM resistance (conductance) or PCM resistance (conductance) property level, as each state is SET/RESET. Thus, RESETTING a state of the PCM, e.g., with a series of voltage pulses, breaks one or more filaments for the respective resistance state and causes the total PCM resistance to increase incrementally.

In like manner, in multistate PCMs, an increment of resistance is removed (e.g., an increment of conductance is added) from (to) the total resistance (conductance) of the PCM resistance (conductance), as each state is SET. SETTING one or more of the states forms one or more filaments associated with the respective resistance state and causes the (total) PCM resistance (conductance), property level, to decrease (increase) incrementall.

In some embodiments, the filaments associated with the respected PCM states are broken or made depending on the magnitude/amount of current flowing through the PCM (caused by an applied voltage) and the amount of time the current flows. In some embodiments, the applied voltage is a number (pulse number) of voltage pulses.

Unfortunately, the increments of resistance added or removed from the PCM resistance are not the same values for any given applied voltage and/or pulse number of applied voltage pulses. In other words, the incremental resistance added or deleted from the (total) PCM resistance (a PCI resistance level) is not uniform or the same for each increment for each equivalent voltage pulse applied to the PCM. As a result, the (total) resistance of the PCM, PCM resistance property level, does not increase or decrease linearly with the number of voltage pulses (pulse number) applied to the PCM. Therefore, the resistance/conductance of the PCM, PCM property level, does not increase/decrease linearly with respect to the pulse number even if the voltage pulses are identical in duration, magnitude, and shape.

PCMs, used as resistive random-access memories (RRAIMs), are considered as a promising technology both for the electronic synapse devices or memristors used in neuromorphic computing as well as for high-density and high-speed non-volatile memory applications. In neuromorphic computing applications, a nonvolatile memory (NVM) device, like a PCM, can be used as and/or referenced by a connection (synapse connection) storinglretiieving values (memory values) by a neural network (NN). Properties of the PCM/NVM, e.g., PCM resistivity/conductivity, current flow, etc. are represented by values stored, read and/or measured in the PCMs making the synapse connection. For example, these stored/read/measured property values can be retrieved/read as values, e.g., weights or constants, used in neuromorphic devices or for other memory retrieval purposes. Multiple SET and/or RESET synapse connections can be connected through a crossbar army where each of the synapse connections has one or more memory states that can be used to store/read values defining parts or all of a fully connected neural network.

Some embodiments of neuromorphic computing devices include very-large scale integration systems containing electronic circuitry to mimic neuro-biological architectures, e.g., present in an animal's nervous system. Some of these neuromorphic computer devices use PCMs with multiple states e.g., approximately 1000 states or more) instead of only two memory states as those PCMs used in storage class memory. Each of these state changes is an incremental change in PCM property, e.g., resistance (conductance), from the previous state. The resultant property state/property level, e.g., resistance (conductance) state, of the PCM device is a result of the incremental state changes and determines the total PCM property or property level, e.g., total PCM resistance (conductance).

For example, the incremental addition/removal of the resistance (conductance) states changes the total resistance/conductance (property level) of the PCM. In some embodiments the incremental addition/removal of resistance (conductance) states is caused by application of a number (pulse number) of voltage pulses to the PCM. Preferably, each of the increases (or decreases) of the resistance/conductance of the PCM changes the property level in a linear manner with respect to the pulse number of identical voltage pulses applied to the PCM. For example, it is desirable that each identical voltage pulse(s) applied to the PCM would cause an equivalent incremental step increase (decrease) of the PCM resistance (conductance). Therefore, each time an identical pulse is applied to the PCM, the (total) PCM resistance (conductance), property level, would change the same amount. A linear increase (decrease) in PCM resistance/conductance with respect to the pulse number of identical pulses can be illustrated by a straight-line plot of (total) PCM resistance/conductance, PCM property level, versus the pulse number (of identical voltage pulses) applied to the PCM.

Unfortunately, this linearity is not the case in real-world PCM devices. With respect to each voltage pulse applied to the PCM, the incremental change to the PCM resistance (conductance) is different, even though the applied pulses may be identical. Therefore, there is a non-linear relationship between the pulse number of pulses applied to the PCM and the PCM property/resistance increases/decrease, PCM property level, resulting from Re-setting/Setting PCM states with the pulse number of pulses.

When PCMs are used as memory devices that store weighting values used in some neuromorphic computing systems, like neural networks, non-linear PCM properties/resistance property levels are problematic. Memory devices made using PCMs that deviate from linearly increasing/decreasing resistance (conductance) levels/states cause non-uniform performance and/or asymmetries, e.g., in crossbar arrays structures, and can provide inaccurate data, e.g., weighting values, used by the neuromorphic computing systems. Accordingly, non-linear PCMs used in PCM memory devices that are used in conjunction with neuromorphic computer systems (or for other memory retrieval purposes) can greatly reduce the training accuracy and performance of these neuromorphic computing systems (e.g., neural networks). See G. W. Burr et al., "Experimental demonstration and tolerancing of a large-scale neural network (165,000 synapses), using phase-change memory as the synaptic weight element," 2014 *IEEE international Electron Devices Meeting*, 2014, pp. 29.5.1-29.5.4, doi: 10.111.09/EDM.2014.7047135, hereinafter "Burr et al."

Some prior art addresses these PCM non-linearity problems by using "conditional pulses" that condition, i.e., pre-SET the resistance of the PCM to a partially crystalized state. This approach has the problem of using only a fraction of the resistance value possible with the PCM and produces PCMs with a small dynamic range.

There is a need for PCMs that linearly increase/decrease property/resistance levels/states with respect to a pulse number of (identical) voltage pulses applied to the PCM. There is a need for KAU with these linear characteristics for use in symmetrical arrays (PCM memory devices) with linearly changing property/resistance levels/states throughout the respective PCM array for accurate data storage and retrieval.

SUMMARY

According to an embodiment of the present invention, a phase change (PCM) memory device includes a PCM and a resistance-capacitance (RC) circuit.

The PCM has one or more PCIVI properties, each PCM property has a plurality of PCM property states. As the PCM property states of a given property are Set or Reset, the PCM property states each produce an incremental change to a property level of the respective/associated PCM property, e.g., PCM conductance. The incremental changes to property level of the PCM memory device are in response to application of one or more of a pulse number of voltage pulses.

Each of the voltage pulses has a voltage characteristic. In some embodiments, the voltage characteristics of all the voltage pulses are identical. In other embodiments, some of the voltage characteristics are different and these differences are used to affect the incremental changes.

The RC circuit produces a configuring current that flows through the PCM in response to one or more of the voltage pulses. The configuring current has a configuring current characteristic. The configuring current modifies one or more of the incremental changes to one or more of the property levels so that the property level changes linearly with respect to the pulse number. The configuring current characteristic can be modified by "tuning" or modifying resistance (conductance) and/or capacitive components of the RC circuit to linearized the property level changes with respect to the pulse number.

In some embodiments, the PCMs are used as synapse connectors. In a memory array, the synapse connectors switchably and selectively connect word lines and sensing lines at the synapse (cross point) where the synapse connector is located. By switching/selecting the synapse connectors (e.g., with a controller), a given property level (e.g., conductance of the PC Nil) of the selected synapse connector is incrementally changed linearly with respect to the number of voltage pulses applied to the PCM(s) in the synapse connector. Then the property level can be read and/or stored as a memory value. In some embodiments, the property level is used as a weighting value in a neuromorphic computing application/system, like a neural network.

Methods of using the memory device and/or the memory array are also disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
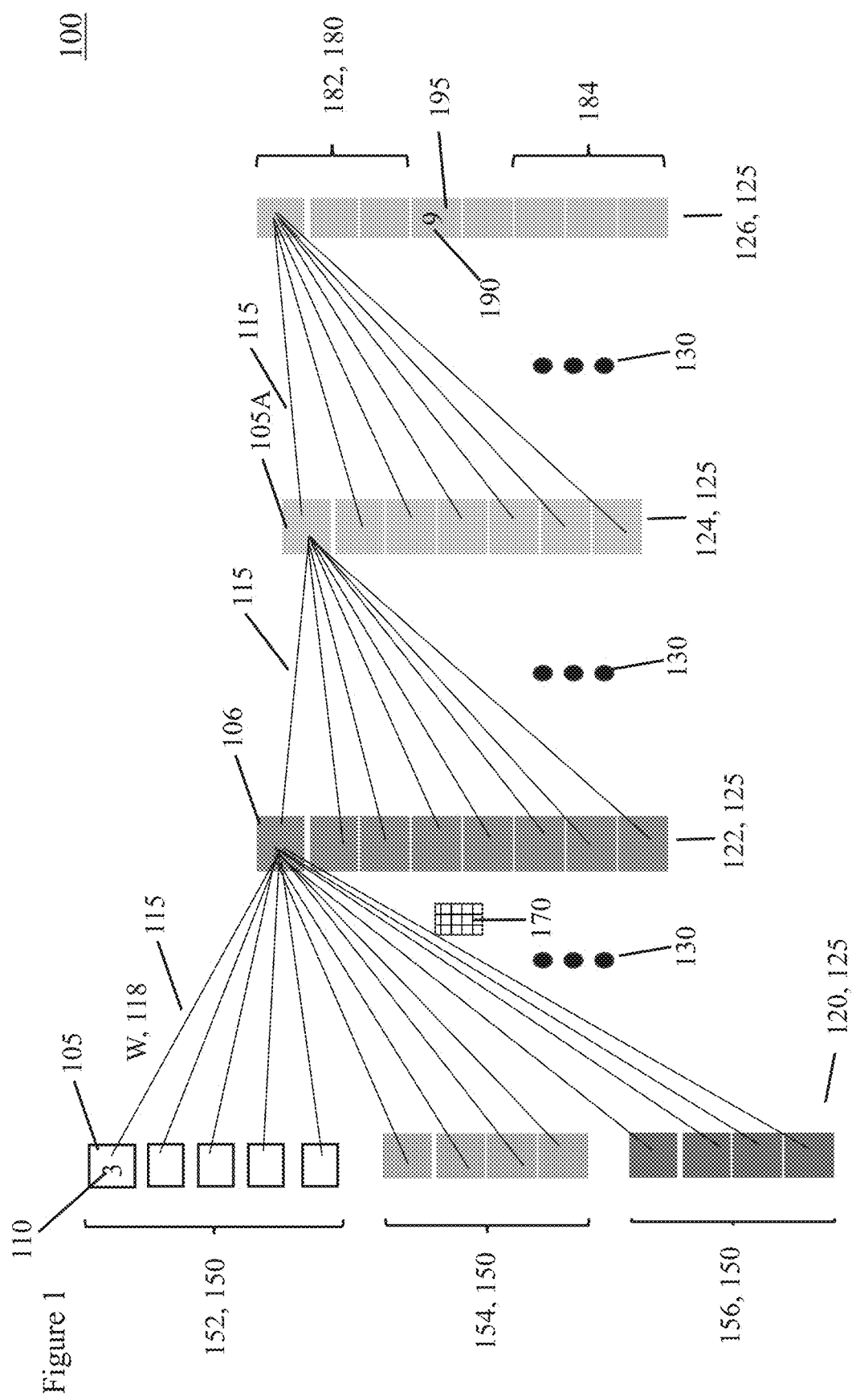
FIG. 1 is a system architectural drawing of one non-limiting example embodiment of a neural network used by the present invention, i.e., a neuromorphic computing application/system.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The devices, components, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neuromorphic computing application/systems (like neural networks), etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Embodiments of the invention include a memory device andlor a memory device used as a synapse connector that includes one or more phase change memories (PCM) with multiple (resistive/conductive) states, i.e., PCM property states. Incremental changes to the one or more (PCM) properties/property states (e.g., resistance) of memory device/synapse connector change the respective/associated (PCM) property level linearly with respect to application of a number (pulse number) of (identical) voltage pulses which SET and/or RESET one or more of the PCM states. A configuring current flows through to the one or more PCMs of the synapse connector while the synapse connector/PCM is being SET/RESET as a result of the applied voltage pulses. The configuring current has a configuring current characteristic so that, when the configuring current is applied, one or more property levels (e.g., resistance) of the PCM, varies linearly with respect to the number of voltage pulses applied to the synapse connector/PCM during SET or RESET. In some embodiments, the configuring current characteristic is produced/modified by resistive and capacitive components of a RC circuit that is part of the memory device and/or synapse connector. In some embodiments, the PCM resistance/conductance property of the PCM(s) in the memory device/synapse connector is the majority resistive component of the RC circuit.

Embodiments of the invention include arrays of these PCM memory devices. These PCM arrays can be used in conjunction with neuromorphic computing devices, like neural networks. As a non-limiting example, one or more of the PCM properties of the PCMs in the arrays are stored and/or read as memory values, e.g., weighting factor measurement/values used by the neuromorphic computing devices.

For example, in some embodiments, a neuromorphic network structure is associated with one or more PCM arrays. The PCM array lias a plurality of cross points or synapse. One of the word lines of the array intersects one of the sensing lines of the array at a synapse or cross point. A synapse connector is placed at each of one or more of the synapses. A switching device is controlled/switched, e.g., by a controller, to selectively and electrically connect/disconnect a respective synapse connector ttvfrom the word line and sensing line at the respective cross point where the synapse connector is placed/connected or located.

Each synapse connector includes a series-parallel RC circuit (RC circuit) that is formed from one or more capacitive components, e.g., a capacitor, that electrically combines with one or more resistive components. In some embodiments, the dominant (or all of the) resistive component is the resistance of one or more of the PCMs in the synapse connector. Thus, each synapse connector includes a series-pnraflel RC circuit (RC circuit) with some or all the resistance in the RC circuit contributed by the resistance/conductance of one or more of the PCMs connected in the respective RC circuit. Various combinations/embodiments of capacitance and/or resistance combined with the resistance/conductance of one or more of the PCMs in the synapse connector are envisioned to form this RC circuit. In one embodiment of the synapse connector, a capacitance (and/or resistance) is connected in parallel with a PCM. Other RC series-parallel combinations of capacitance/resistance and PCM resistance/conductance are envisioned.

The RC circuit of each of the synapse connectors responses to an applied voltage pulse by causing a configuring current to flow through one or more of the PCM(S) in the respective synapse connector. The configuring current has a configuring current characteristic that is defined by the applied voltage from the voltage pulse and the resistive and capacitive components of the series-parallel RC circuit. For a proper value of capacitance (and/or resistance/conductance) in the series-parallel RC circuit forming the synapse connector, the configuring current flows through one or more of the PCMs with a configuring current characteristic that has a magnitude and shape that improves linearity of a PCM propern-level (like PCM reststanct-capacitance level) with respect to the pulse number of voltage pulses that are applied to the PCM(s) during the SETTING/RESETTING of each of one or more of the PCM states.

Embodiments of the PCM array include multiple synapse connectors, each with one or more PCMs, where each PCM has one or more PCM properties, e.g., resistance value, that can be set to different state values, i.e., at multiple PCM states, of the PCM. In some embodiments, the PCM property/resistance values vary from about 10 K-Ohm to about 100 K-Ohm.

In some embodiments of the PCM array, some or all of the capacitance for each RC circuit is a capacitor (common capacitor) connected to a word line of the PCM array so that the capacitor is connected in common with each synapse connector (or a set of synapse connectors) selected and energized by the controller for one or more of the voltage pulses. When one of the synapse connectors (or a set of synapse connectors) in the word line is selected/energized, the common capacitor combines with the PCM resistance in the selected synapse connector to form the RC circuit making up the selected synapse connector. Other configurations, including common resistors connected in a similar way, are envisioned.

In some embodiments, the common capacitor has a capacitance of about 50 fentofarads (fF) or in a range between 25 and 75 fF.

In some embodiments, linearity of each PCM property (e.g., resistance) is improved by modifying the configuring current characteristic 575A/575B (see FIG. 5) adjusting the RC the time constant of the series-parallel RC circuit in each synapse connector.

In some non-limiting embodiments, the configuring current characteristic 575A/575B can be modified by the applied voltage pulse. The voltage pulses have pulse characteristics including, leading-edge rise time/duration, maximum voltage or maximum voltage magnitude, pulse width time/duration, and trailing-edge fall time/duration. In alternative embodiments, one or more of these voltage pulse characteristics can be modified to adjust/modify the contiguiing current characteristic.

As a non-limiting example, the SET pulse is a voltage pulse with an abrupt/short leading-edge rise time and a slow/long trailing-edge fall time. In one embodiment the rising edge of the pulse lasts about 1 nanoseconds (ns), the pulse width time lasts about 5 ns, and the trailing-edge fall time lasts about 5 ns. In some embodiments of the invention, a pulse with sharp failing edge low energy, is used to establish high resistance (low conductance) resistance levels/states and a pulse with to trailing edge is used to establish low resistance (high conductance) resistance levels/states. In some embodiments the voltage pulses are identical with identical voltage pulse characterics.

FIG. 1 is a system architectural drawing of one non-limiting example embodiment of a neural network 100 of the present invention, i.e., a neuromorphic computing application/system 100.

The example neural network 100 comprises a plurality of neurons, typically 105. Each of the neurons 105 can store a value called an activation 110. For example, neuron 105 holds an activation 110 of value "3". Most of the neurons and activations have no reference number in FIG. 1 for clarity.

The neural network 100 can comprise a plurality of layers, e.g., 120, 122, 124, 125, and 126, typically 125. There is a first layer or input layer 120 and a last layer or output layer 126. Between the input 120 and output 126 layer there are one or more hidden layers, e.g., 122, 124. Each of the layers 125 has a plurality of neurons 105. In some embodiments, the number of layers 125 and the number of neurons 105 in each of the layers 125 is determined empirically by experimentation.

In some embodiments, all the neurons in a previous layer are each connected by an edge, typically 115, to each one of the neurons of a next layer. For example, a typical neuron 106 in a next (e.g., hidden) layer 122 is individually connected to each of the neurons 105 in the input layer 120 by an edge 115. In some embodiments, one or more of the edges 115 has an associated weight, W 118. In similar manner 130, each neuron 106 in a next layer, e.g., 122, is connected individually by an edge 115 to every neuron 105 in a previous layer, e.g., 120. The same type of connections 115 are made between each neuron in the second hidden layer 124 to each neuron of the first hidden layer 122 and likewise between each neuron 195 of the output layer 126 and all the neurons of the second hidden layer 124. These connections 130 are not all shown in FIG. 1 for clarity.

In some embodiments, the activation 110 in each neuron 106 is determined by a weighted sum of the activations 110 of each connected neuron 105 in the previous layer. Each activation 110 is weighted by the weight (w, 118) of the edge 115 each connecting the neuron 106 to each of the respective neurons 105 in the previous layer, e.g., 120.

Accordingly, a pattern of activations 110 in a previous layer, e.g., 120, along with the weights (w, 118) on each edge 115, respectively, determine the pattern of activations 106 in the next layer, e.g., 122. In like manner, the weighted sum of set of activations 106 in the previous layer, e.g., 122 as a previous layer, determine the activations of each neuron, typically 105A, and therefore the activation pattern of neurons in the next layer, e.g., 124. This process continues until there is a pattern of activations represented by the activation, typically 190, in each of the neurons 195 in the output layer 126. Therefore, given a pattern of activations 105 at the input layer 120, the structure of the neural network 100, the weights (w, 118) and biases, b, (described below) determines an activation output pattern that is the activation of each of the neurons, typically 195, in the output layer 126. The set of activations in the input layer 120 are changing and therefore the set of activations in the output layer 126 are changing as well. The changing sets of activations in the hidden layers (122, 124) are levels of abstraction that may or may not have a physical significance.

In some embodiments, the input layer 120 is optionally subdivided into two or more sublayers, e.g., 152, 154, and 156, typically 150.

Input sublayer 152 is an input sublayer that in some embodiments receives activation 110 from a first subset of inputs. Similarly, input sublayer 154 (156) are input sublayers that in some embodiments receive activations 110 from a second (third) subset of inputs.

In some embodiments, the output layer 126 is optionally subdivided into two or more sublayers, e.g., 182 and 184, typically 180.

One mathematical representation of the transition from one layer to the next in the neural network 100 is as follows:

$$\begin{bmatrix} a_0^1 \\ a_1^1 \\ \vdots \\ a_n^1 \end{bmatrix} = \sigma \left( \begin{bmatrix} w_{0,0} & w_{0,1} & \cdots & w_{0,k} \\ w_{1,0} & w_{1,1} & \cdots & w_{1,k} \\ \vdots & \vdots & & \vdots \\ w_{n,0} & w_{n,1} & \cdots & w_{n,k} \end{bmatrix} \times \begin{bmatrix} a_0^0 \\ a_1^0 \\ \vdots \\ a_k^0 \end{bmatrix} + \begin{bmatrix} b_0 \\ b_1 \\ \vdots \\ b_n \end{bmatrix} \right)$$

$$\text{or } a^1 = \sigma(Wa^0 + b)$$

where an1 is the activation 110 of the nth neuron 106 in the next level, here level 1; wn,k is the weight (w, 118) of the edge 115 between the kth neuron 105 in the current level, here level 0 (120), and the rith neuron 106 in the next level, here level 1 (122); and bn is the bias value for the weighted sum of the nth neuron 106 of the next level.

In some embodiments, the bias value can be thought of as a threshold value for turning on the neuron.

The term σ is a scaling factor. For example, the scaling factor can be the sigmoid function or the rectified linear unit, e.g., ReLU(a)=max (0, a).

The neural network is trained by finding values for all the weights (w, 118) and biases, b. In some embodiments, known backward propagation methods are used to find the weight and bias values.

In some embodiments, to start the training, the weights and biases are set to either random values or some initial value set. The output, i.e., the activation pattern of the output layer 126 is compared to a desired result. A comparison of the actual output to the desired result through a cost function (e.g., the square root of the sum of the squares of the differences) measures how close the output is to a desired output for a given input. The cost function is minimized, e.g., by a gradient descent method, through an iterative process to determine how to change the weights and biases in magnitude and direction to approach the desired output. The weights and biases are changed, i.e., backward propagated, and another iteration is done. Multiple iterations are done until the output layer produces an activation pattern that is close to the desired result for a given activation pattern imposed on the input layer.

In alternative embodiments, the neural network 100 is a convolutional neural network (CNN). In the CNN, one or more of the hidden layers is a convolutional layer where a convolution is performed using one or more filters to detect, emphasize, or de-emphasize patterns in the layer. There are different filter types, e.g., to detect sub-shapes in images and/or sound sub-patterns in speech or music. In preferred embodiments, the filter 170 is a matrix of values that convolves over the inputs to the layer to create a new pattern of inputs to the layer.

As described below, in some embodiments, each of these weights is determined by a resistance or other physical property of an associated PCM (or one or more associated PCMs) or synapse connector 250 in an array of PCMs. It is noted that if the property/resistance of one or more of these associated synapse connectors 250 is not linear, the weighting 118 used by the neuromorphic computing application/system 100 will be inaccurate and performance of the system 100 will be adversely affected.

Figure 2:
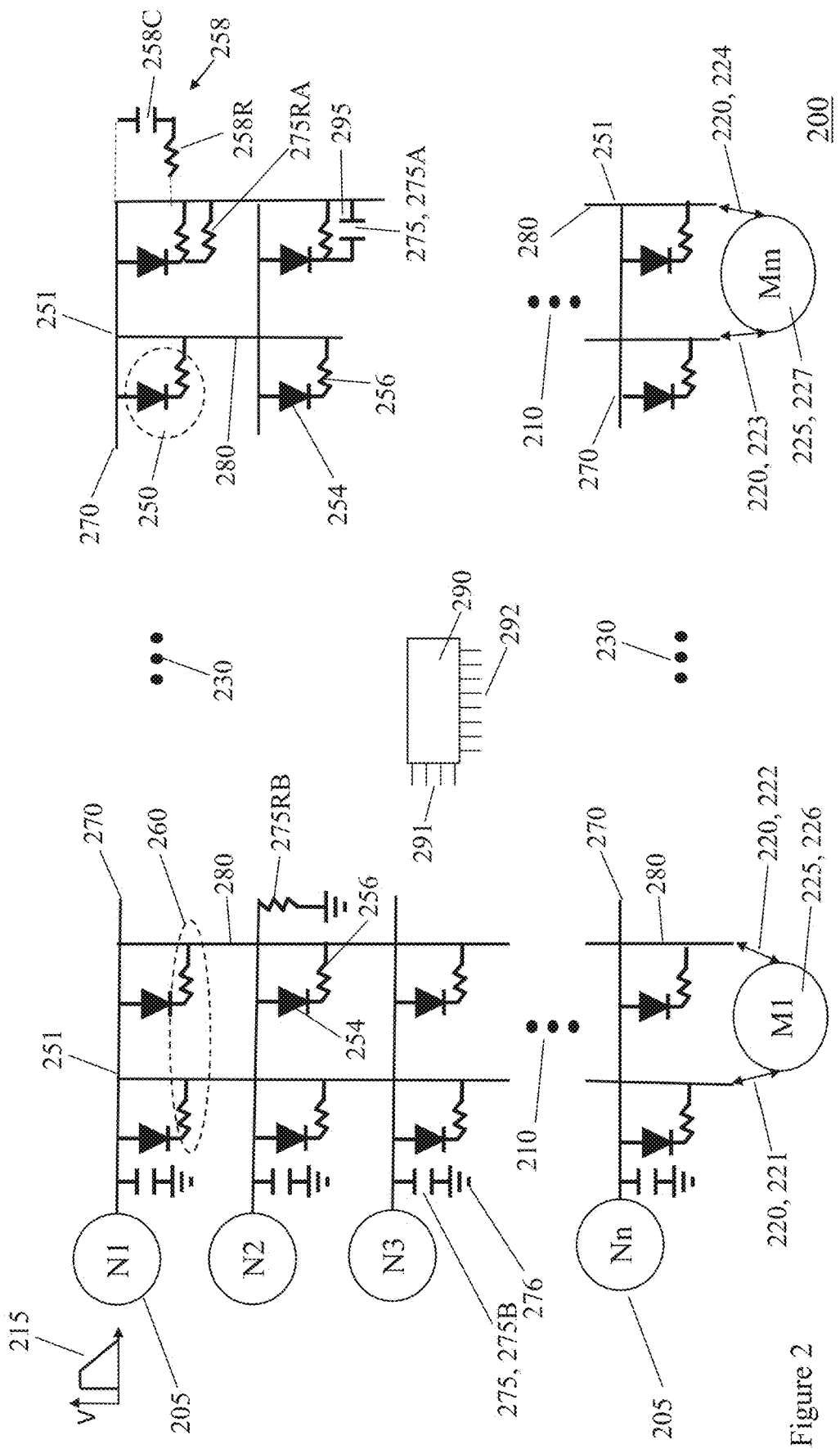
FIG. 2 is a system architectural drawing of a PCM array with PCM memory devices used as synapse connector and used to store and retrieve data, e.g., weighting values for neuromorphic computing systems, where each of the PCM's in the PCM array has a PCM property, like resistance (conductance), with a property level that increases and decreases linearly with the application of a pulse number of identical voltage pulses applied to the respective PCMs/synapse connector.

FIG. 2 is a system architectural drawing of a PCM array 200, e.g., a crossbar array 200. The PCM array 200 can be implemented in conjunction with one or more neuromorphic computing systems, e.g., 100, where each of one or more of the synapse connectors 250 (each with one or more resistive components, e.g., PCM's, typically 256) in the array 200 has one or more PCM properties, e.g., a PCM resistance, and multiple PCM (property) states. In some embodiments, the PCM property/resistance level increases and decreases linearly with the application of a number (pulse number) of pulses (e.g., voltage pulses) selectively applied to each of the synapse connectors 250. One or more of the voltage pulses Set/Re-set one or more of the property states, thereby incrementally increasing/decreasing the property level. In some embodiments, each of the applied pulses is identical, meaning the applied pulses have the same pulse characteristics, i.e., rise and fall times, maximum and minimum levels, time durations, shape, etc.

In some embodiments, the PCM array 200 is a PCM memory device 200 structured as an array 200, e.g., as a crossbar array 200. The array 200 is used to store and retrieve data (memory values), e.g., weighting values 118 (and/or bias values, b), for the associated neuromorphic computing system(s), like system 100.

Typically, the PCM array 200 has an "n" number of inputs, N, typically 205, and an "in" number of outputs M, typically 225.

Each input 205 is connected to word line, typically 270, that extends 230 across the PCM array 200. Depending on the configuration of the PCM array 200, each output 225 is connected (221, 222, 223, and 224, typically 220) to one or more sensing lines, typically 280.

The PCM array 200 has a number (n×m) of cross points or synapses, typically 251, which are actual or virtual locations 251 where one of (a first) word line 270 intersects one of (a first) sensing line, typically 280. Generally, (except for a synapse connector 250) there is no electrical connection between the respective first and word line 270 and first sensing line 280 at these cross points/synapses 251. However, at one or more of the synapses 251 an electrical connection between the respective first word line 270 and first sensing line 280 can be selectively and switchably connected and disconnected by a synapse connector 250 as described below.

Note that not all cross points/synapses 251 and synapse connectors 250 are shown for clarity. For example, some cross points/synapses 251 and some synapse connectors 250 are omitted in the vertical 210 and horizontal 230 directions in the PCM array 200.

A synapse connector 250 is made of a switching element 254, a RC circuit 295, and one or more nonvolatile memories (NVMs) 256. In some preferred embodiments, the NVMs 256 are one or more phase change memories (PCM) 256, where one or more of the PCM has multiple (property) states. In more preferred embodiments, each synapse connector 250 is a combination of the capacitance 275 (typical capacitive components 275), one or more NVM/PCMs 256 (that in some embodiments provide some or all of the resistive component, typically 256), and one or more switching elements 254. In this non-limiting example, the RC circuit is made from a capacitive component, 275/275A and a resistive component, typically 256.

In different embodiments, the capacitive component, typically 275, is a single capacitance associated with a word line 270 and/or individually capacitance 275 associated with each of one or more of the synapse connectors 250 at each synapse 251 in the word line 270. Capacitive components, typically 275, of the RC circuit 295 can include an external capacitor 275A connected with a single PCM's, one or more stray capacitors 258C, one or more external common capacitors (common capacitors) 275B connected in common with two or more of the PCM's, e.g., a set 260 of PCMs like all the PCMs 256 connected to the word line 270 to which the common capacitor 275B is connected.

In other embodiments of the RC circuit 295, some of the resistive component, typically 256, can be configured in alternative ways. For example, a single PCM's can connect to an external resistor 275RA individually, the resistive component can include stray resistance 258R, and/or one or more external common resistors (common resistors) 275RB can connect in common with a set 260 of PCM's. In some embodiments, the level of resistance/conductance 256 of the PCM 256 makes up most or all the resistive component of the respective RC circuit 295.

The synapse connector 250 can be configured so that the switching element 254 (and/or connection(s) 220) electrically connects or disconnects (switchably connects and disconnects) the word line 270 and sensing line 280 through the synapse connector 250 located at the respective synapse 251 along with the series-parallel RC circuit (RC circuit) associated with the selected and energized synapse connector 250. As described further below, the combination of the capacitance component, typically 275, and resistive components, typically 256, with one or more NVN'LPCMs 256 in the synapse connector 250 forms a series-parallel resistive-capacitive (RC) circuit (RC circuit) 295.

Figure 3A:
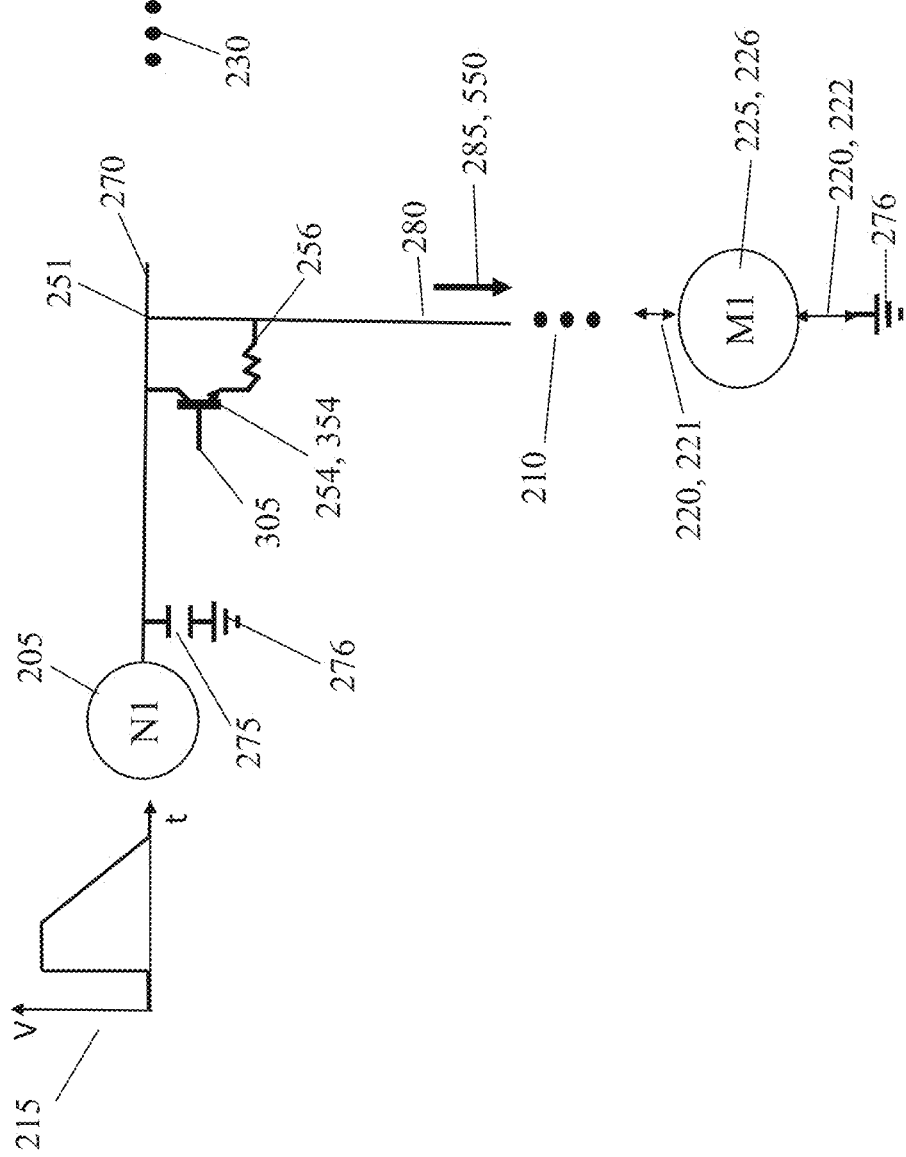
FIG. 3A is a non-limited example of a synapse connector as one embodiment with a RC circuit.
Figure 3B:
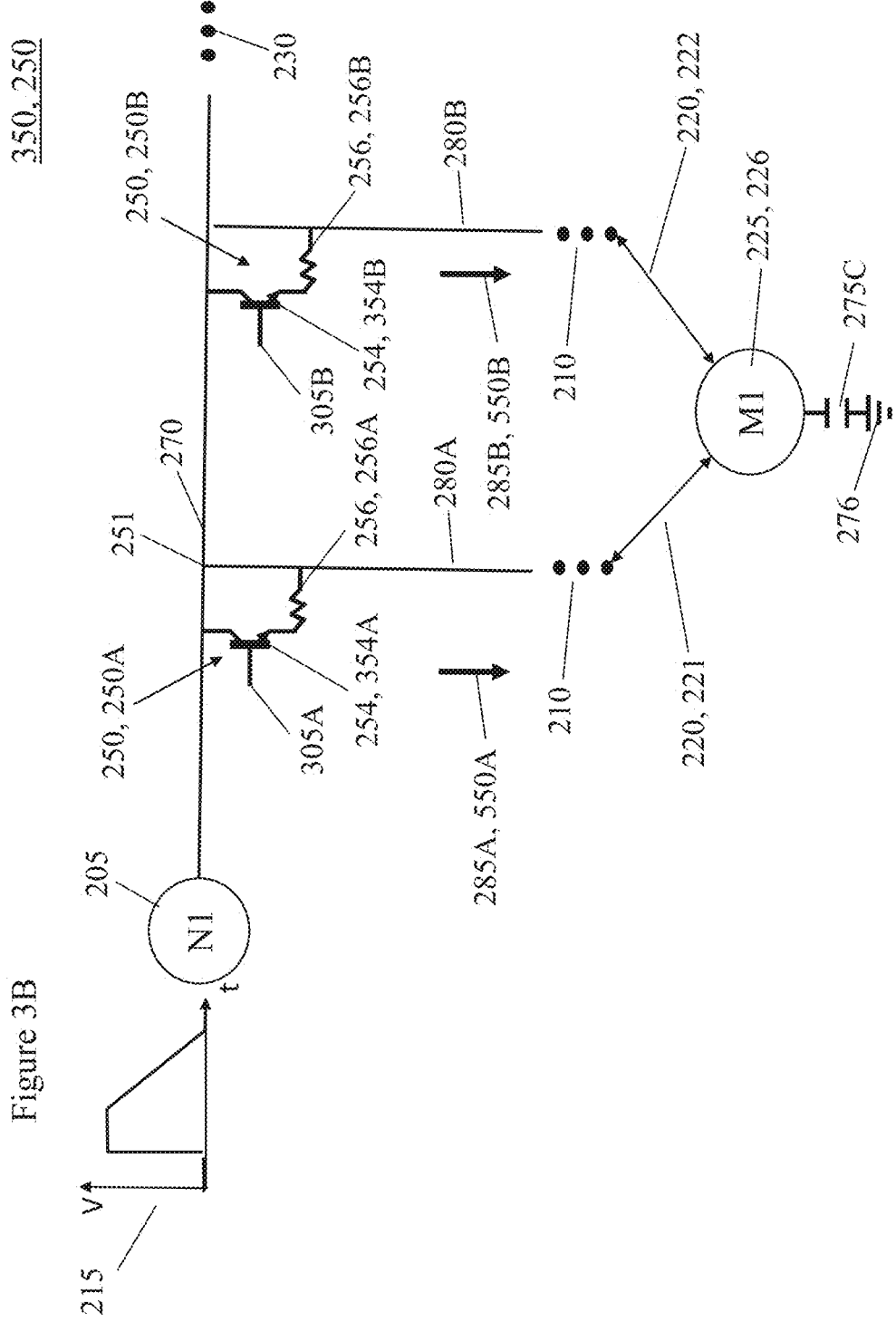
FIG. 3B is a non-limited example of a synapse connector as an alternative embodiment with a RC circuit.

When the respective switching element 254, controller 290, and/or connections 220 are configured to connect or disconnect the respective word line 270 and sensing line 280 through the selected synapse connector 250, one or more voltage pulses 215 is/are applied to the respective/connecting word line 270 and synapse connector 250 causing a current (285A and 285B, typically 285, with a configuring current 550 component, as shown in FIGS. 3A and 3B, see also description of 500 in FIG. 5) to flow through the one or more of the NMV/PCMs 256 in the synapse connector 250. These configuring currents 285/550 SET and/or RESET the NMV/PCMs 256 (and/or NMV/PCM property states) through which they flow.

The configuring current 550 has a configuring current characteristic 575A/575B (see FIG. 5) determined by the response of the RC circuit 295 associated with the synapse connector 250. For example, the configuring current 550 is cause by the RC circuit 295 response, to the electrical connection (disconnection) to and application (removal) of one or more the voltage pulses 215, made or broken by the switching element 254 and/or connection(s) 220.

The RC circuit 295 is designed so that the RC circuit response to the voltage pulse 215, e.g., the configuring current 550, is a component of current 285. The configuring current 550 has a configuring current characteristic 575A/575B used to SET (or Re-set) one or more of the PCMs 256 in the synapse connector 250.

Figure 5:
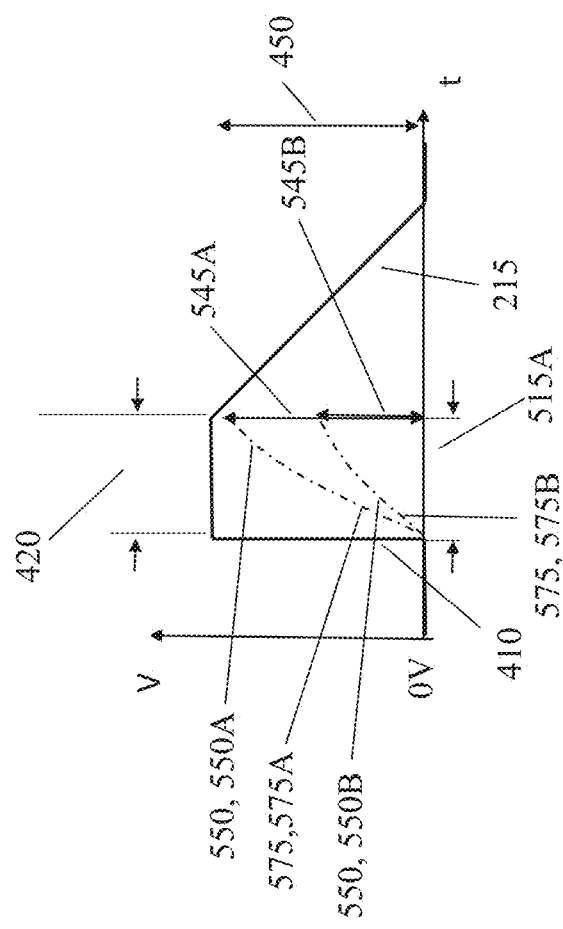
FIG. 5 is a graph of an example voltage pulse and current response versus time for different resistive component values of the series/parallel RC circuit (RC circuit) in a selected, energized synapse connector.

Note that more generally, the series-parallel RC circuit 295 or RC circuit 295 is a combination of components that cause a configuring current 550 that makes up some or all of the component current(s) 285 (shown in FIGS. 3A, 3B, and 5). As described in more detail below, the configuring currents) 550 have a configuring current characteristic 575A/575B that is used to linearize one or more property levels (e.g., conductance) of one or more of the PCMs 256 and/or synapse connectors 250.

The RC circuit 295 can be made in many ways, as long as it produces a desired configuring current characteristic 575A/575B. For example, the RC circuit 295 can be a different circuit customized for each of one or more synapse connectors 250. In some embodiments, the resistance, typically 256, of the RC circuit 295 can be solely or primarily the resistance of each of the PCMB 256 or synapse connectors 250. However, values of stray resistance 258R and stray capacitance 258C as well as individual external resistance 275RA and capacitance 275A, and common resistance 275RB and capacitance 275B can be included as/with the RC circuit 295 to produce the desired configuring current characteristic 575A/575B for each of the synapse connectors 250/PCMs 256.

The resistance 256 of each of the synapse connectors 250/PCMs 256 can included solely the resistance of the respective PCM 256. Alternatively, the resistance, typically 256, can include a second external resistance 275RA connected to each of the one or more respective PCM 256. In other embodiments, the resistance 256 can include a common external resistance (common resistance) 275RB connected to a word line 270 and according connected to each selected/energized PCM 256/synapse connector 250 on a common word line 270. The common resistance 275RB can to a word line 270 and/or sensing line 280 to add a common resistance component to the RC circuit 295 of a set 260 of PCMs 256, e.g., those connected to the same word line 270.

The capacitance 275 of the RC circuit 295 can also include stray capacitance 258C; individual, custom capacitance 275/275A attached to each of one or more of the synapse connectors 250/PCMs 256; a capacitance 275/275B attached to a common word line 270; and/or capacitance 275/275C connected to a common sensing line(s) 280.

The combined capacitance components, typically 275, and combined resistive components, typically 256, are the capacitance 275 and resistive 256 components of the RC circuit 295 and are chosen such that the non-linear configuring current characteristic 575A/575B of the RC circuit response causes one or more property levels (e.g., resistance/conductance) of the PCMs 256 and therefore the synapse connector 250 to change (increase and decrease) linearly with respect to the pulse number of (identical) voltage pulses 215 applied to an associated input 205 and word line 270. The non-linear RC response/configuring current characteristic 575A/575B is designed to modify the non-linear state actual changes of the PCM to produce a more linear property level with respect to the pulse number of pulses.

Note that the switching element 254 is shown as a diode in FIG. 2. In this embodiment the switching element 254 would switch on, e.g., the diode 254 shorts, when the voltage pulse 215 is applied to the associated input 205 with a magnitude higher than the diode 254 offset voltage. This is only one non-limiting example of a switching element 254. Other switching elements 254 and configurations are envisioned. For example, a switching element 254 might be a bipolar transistor or a field effect transistor, FET.

Further, the resistive impedance, typically 256, e.g., the impedance of the PCM, is shown as a single, series connected impedance. Other numbers of resistive elements 256 and/or other series/parallel connection configurations of the resistive, typically 256, and capacitive, typically 275, components are envisioned.

In addition, different embodiments of the capacitive component 275 are envisioned that connect in series-parallel combinations with the resistive components 256 to create the synapse connector 250 that includes the series-parallel RC circuit that produces a RC response/configuring current characteristic 575A/575B. Connections 220/276 are made to ground and/or other components, using known methods to form these series-parallel RC circuits 275/256.

Further, in some embodiments, stray capacitance 258C and stray resistance 258R can cause addition stray RC circuit effects that might need to be considered when designing the series-parallel RC circuit 256/275 and the RC response/configuring current characteristic 575A/575B.

The pulses 215 are applied to one of the inputs 205 and the associated word line 270 as controlled by known technologies, e.g., a decoder circuit/controller 290. The controller 290 can have controller inputs 291 and controller outputs 292. For example, a constant voltage (not shown) applied to one or more of the controller inputs 291 can be switched and/or modified by the controller 290 to produce one or more voltage pulses 215 that are applied to the inputs 205 of the PCM array 200. Connections to and from the controller 290 are not shown for clarity.

As an example, the controller will connect/disconnect a voltage source (not shown) that provides one or more pulses to the selected/connected word line 270. By switching on and off the output connections 220, 221, 222, 223, and 224, typically 220, the output M 225 is connected through one or more of the synapse connectors 250 from the word line 270 that the controller selects and energizes to one of the outputs 225. Accordingly, in some embodiments, by the controller 290 selecting which word lines 270 and sensing lines 280 are connected and disconnected, individual synapse connectors 250 are switched, selected, and energized and switched, de-selected, and de-energized so that the PCMB in the selected/energize synapse connectors 250 are selectively Set and Re-set by application of inputs 205. These controllers 290 and their selection, energizing, and de-energizing of synapse connectors 250 in PCM arrays, like the PCM array 200, are well known.

The outputs, M, typically 225 can serve multiple functions depending how the controller makes and breaks output connections 221, 222, 223, 224, typically 220. For example, the controller can select a word line, e.g., N3 270, and a sensing line 280 that energies one of the synapse connectors 250 by applying one or more pulses through the selected synapse connector 250. In this way one or more of the synapse connector 250 states is Set/Re-set by application of one or more, the pulse number, of pulses 215, e.g., identical pulses.

Alternatively, the controller 290 can apply a read voltage/current on the selected word line, e.g., 270. The controller 290 would connect 220 the output 225 in a configuration that would measure/read one or more of the physical properties of the synapse connector 250 or one or more of the property levels of the synapse connector 250 at the then existing property level value.

The physical properties measured include values of any measurable physical characteristic of the NVM/PCM 256 like current, differential current, voltage, differential voltage, conductivity, resistance, and/or etc.) In some embodiments, these measured PCM property values are used as values (memory values), e.g., associated weights 118 and/or bias values, for the for the associated neuromorphic computing system(s), like system 100. Reading memory values using decoders is known.

In still another embodiment, the controller 290 can select one of the synapse connectors 250 to perform a RESET of one or more of the synapse connector 250 states.

FIG. 3A is a non-limited example of a synapse connector 250 circuit/device 300 with a single PCM 256 as one embodiment of a RC circuit 295. In this embodiment, the switching element 254/354 is a transistor like a field effect transistor (FET) or bipolar transistor. The controller 290 has biased the transistor 354 input 305 to put the transistor 354 in the "On" state so that common capacitance 275, NVM/PCM 256, and the voltage pulse 215 applied at input 205 are connected in parallel to form a parallel series-parallel RC circuit 295. A current 285, with a configuring current component 550, flows through the respective sensing line 280 as a single output current 285 connected (221/220 and 222/220) and measured 225/226 at the output 225. The configuring current 550 has a configuring current characteristic 575A/575B (see FIG. 5) as determined by the resistive 256 and capacitive 275 components of the RC circuit 295. Examples of resultant physical properties that are measured as values (e.g., weighting values 118) include the magnitude of current measured when a constant sensing voltage is applied by the controller 290, total resistance across the NVM/PCM 256 (constant sensing voltage divided by a steady state current flowing through the sensing line 280), etc.

FIG. 3B is a non-limited alternative example of a synapse connector 250 with two PCMs 256/256A/256B making the resistive component 256 of the series-parallel RC circuit 295 (the common capacitive element shown as 275C, connected in series with the output 225). In this embodiment, the switching element 354A/354B are simultaneously turned on and off by the controller 290 applying/removing a control voltage to the transistor bases 305A/305B. When the switching elements 354A/354B are in the ON state, the voltage pulse 215 applied at input 205 cause a first current 285A with a first configuring current component 550A to flow through first sensing line 280A and a second current 285B with a second configuring current component 550B to flow through a second sensing line 280B. The configuring currents 285A/285B combine to flow through the output measuring device 225 through connections 220/221 and 220/222 respectively and through the capacitance 275B.

In this embodiment, the physical property measured 225/226 at the output 225/226 are the combined (or differential) configuring currents 285A and 285B. These differential currents 285A and 285B can enable differential voltages for measurement 225. The capacitance 275B is connected in common with these two current flows 285A/285B and forms some or all of the (common) capacitance 275/275C of the series/parallel RC circuit 295 combined with the impedances/resistance of the NVM/PCMs 256A/256B.

Figure 4:
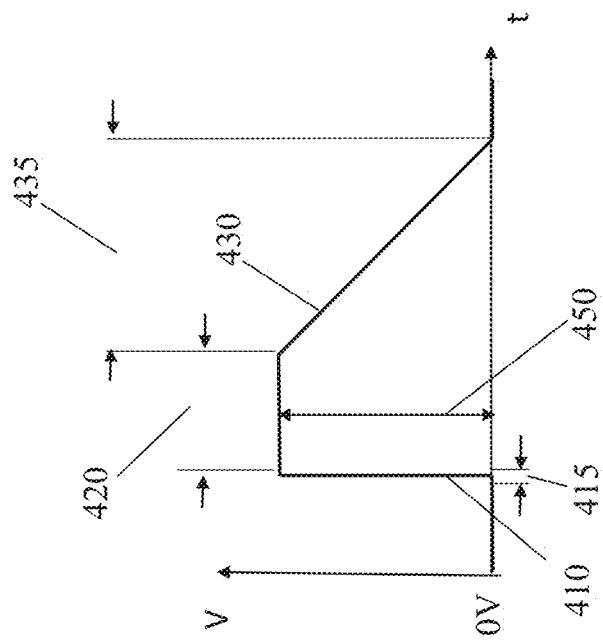
FIG. 4 is a graph of an example voltage pulse versus time, showing one or more pulse characteristics.

FIG. 4 is a voltage versus time graph of an example voltage pulse 400/215 with one or more voltage pulse characteristics. In some embodiments, the voltage pulse 400/215 characteristics include one or more (e.g., voltage) magnitudes, durations, and shapes designed to Set and/or Re-set one or more states of one or more physical properties of one or more PCMs in the series-parallel RC circuits 295 of the synapse connector(s) 250 selected for Setting/Resetting by the controller 290. In some embodiments, the pulse number (of identical voltage pulses 215/400), e.g., one or more voltage pulses, are applied to the PCM 256 of the selected synapse connector 250.

The non-limiting example of the voltage pulse 215/400 has a shape that includes a leading edge 410 with a leading-edge 410 rise time (duration) 415; a maximum pulse voltage or maximum pulse voltage magnitude 450 with a pulse width time (duration) 420; and a trailing-edge (voltage magnitude) 430 with a trailing-edge 430 fall time (duration) 435.

The voltage pulse 400/215 is provided as an example. The actual shape and voltage levels of the pulse 400/215 will specifically depend on the PCM material and device properties. For example, a typical voltage pulse 400/215 used to update the PCM weight values 118 in a crossbar array 200 has a pulse width time 420 of about 10 ns and a maximum pulse voltage of about 2V 450.

In some embodiments, the leading 410 voltage rises from a minimum voltage level, e.g., zero volts, to the maximum pulse voltage 450 very rapidly. However, the leading-edge rise time 415 across the synapse connector 250 is affected and controlled by the component values of the capacitance and resistance in the series-parallel RC circuit 295 in the selected and energized synapse connector 250 circuit. Also, the trailing-edge 430 shape and trailing-edge 430 fall time 435 are also affected and controlled by the component values of capacitance and resistance in the series-parallel RC circuits 295 of the selected and energized synapse connector 250.

In FIG. 4, the leading-edge rise time 415 is relatively short, on the order of between 1 and 2 nanoseconds (ns). Shorter leading-edge rise times 415 are enabled when the resistive component of the selected, e.g., 256, energized series-parallel RC circuit 295 is relatively low. For synapse connectors 250 with RC circuits 295 with higher resistive components, e.g., when the resistance of the NVM/PCMs 256A/256B or the total resistance of the RC circuit 275/256 is (or becomes) high, the resulting leading-edge rise time 415 will be longer. Accordingly, as the total resistance (component) of the selected and energized synapse connector 250 series/parallel IC circuit 295 increases (conductance decreases), the leading-edge rise time 415 will also increase.

In FIG. 4, the trailing-edge 430 fall time 435 is longer, on the order of between 5 and 10 nanoseconds (ns). Longer trailing-fall times 435 are enabled when the resistance component of the series-parallel RC circuit 295 of the selected, energized NVM/PCMs 256A/256B is relatively high. The trailing-fall time 430 is longer for synapse connectors 250 with RC circuits 295 with higher resistive components, e.g., the resistance 256A/256B of the series/parallel RC circuit 295 of the selected, energized NVM/PCMs 256A/256B is relatively high. Accordingly, as the total resistance (component) of the selected and energized synapse connector 250 increases (conductance decreases) the trailing-edge fall time 435 becomes longer.

FIG. 4 is presented as an example of how the shape, timing, and effect of the applied pulses 215/400 is affected by the resistive 256 and capacitive components 275 of the series/parallel RC circuits 295 of the selected, energized synapse connector 250. In particular, FIG. 4 illustrates how the effect (changes in property level) of the applied pulses 215/400 changes as the (total) resistance of the PCMs 256 changes due to the Setting and/or Re-setting of one or more property levels of the PCM 256.

FIG. 4 is not presented to illustrate any operational condition or state of the pulses 215/400, PCMs 256, nor any series-parallel RC circuit 295.

FIG. 5 is a graph 500 of an example voltage pulse 215/400 and configuring current (component) 550A/550B versus time (with different scales for voltage and current) for different resistive component values (typically, 256) of the series-parallel RC circuit 295 in a selected, energized synapse connector 250.

The voltage pulse 215 has a leading-edge voltage 410 with a leading-edge rise time (not shown, see FIG. 4, 415) and a maximum voltage magnitude 450 with a voltage pulse width time (duration) 420. In some embodiments, the maximum voltage magnitude 450 is between 1 and 3 volts, typically 2 volts. The voltage pulse width time/duration 420 is between 5 ns and 20 ns, typically between 5 ns and 10 ns, inclusive. The leading-edge rise time (not shown) 415 is typically between 0.5 ns and 5 ns.

The controller 290 (and/or connections 220) directs/applies the voltage pulse 215 through one of the inputs 205 to apply to the voltage pulse 215 to energize one or more of the selected synapse connectors 250. Each of one or more of the synapse connectors 250 has a series-parallel RC circuit 295 that has a capacitive component, e.g., 275/275A/275C/258C, and a resistive component 256. The capacitive component includes the capacitor and/or any other capacitor elements, typically 275, (e.g., individually connected capacitors connected at the synapse 251, stray capacitance 258C, and/or common capacitors 275B, etc.) in the selected synapse connector 250. Some or nearly all of the resistive component includes the total resistance level of one or more of the PCMB in the synapse connector 250 and any other individually or commonly connected resistance (e.g., 275RA and 275RB) included/connected to the PCMs 256. Stray capacitances 258C and resistances 258R may or may not significantly contribute to the capacitive 275 and resistive components 256 of the RC circuit 295, respectively. These RC circuit component capacitances 275 and resistances 256 can be connected in parallel, series, and/or parallel/series combinations in a variety of known configurations to result in the series-parallel RC circuit 295 of each of the synapse connectors 250.

The resistive 256 and capacitive 275 components of the series-parallel RC circuit 295 determine the current characteristics 575 and configuring current 550 response in the series-parallel RC circuit 295 current flowing through one or more of the PCMs 256 in the synapse connector 250. For example, changing the value of the resistance component 256 level of the series-parallel RC circuit 295 will change an RC circuit response and the transient configuring current 550 flowing through the series-parallel RC circuit 295 for a given applied voltage. Series-parallel RC circuits 295 and their current response 575 to a given voltage are known.

In some embodiments, the configuring current response 575 of the series-parallel RC circuit 295 in a selected, energized synapse connector 250 is dominated by the value of (total) PCM resistance level 256 of one or more PCMs 256 in the selected, energized synapse connector 250. This (total) PCM resistance/conductance level is dependent on the state (of the multiple states) in which the PCM 256 is Set/Re-set.

In addition to the voltage pulse 215, FIG. 5 shows two example configuring current responses 575A and 575B, typically 575, for two different property levels of the one or more PCMs within the selected, energized synapse connector 250. The configuring current response 550 has a configuring current characteristic 575A/575B for a synapse connector 250 with a series-parallel RC circuit 295 where the resistive component, including the resistance/conductive property at a respective PCM level, is a smaller resistance. The second configuring current 550/550B response 575/575B has a configuring current characteristic 575B for a synapse connector 250 with a series-parallel RC circuit 275/256 where the resistive component is a larger resistance level due to a increase in resistance/decrease in conductance property of the PCM 256.

Given the maximum voltage magnitude 450 and voltage pulse width time 420 for a given applied voltage pulse 215, examination of the graph 500 of voltage/current versus time shows that the configuring current characteristic 575A (with a state of lower value of resistive component 256 property level in the RC circuit 295) has a steeper initial slope 575A and reaches a higher maximum configuration current 545A during the voltage pulse width time 420. Also, for the same voltage pulse 215, maximum voltage magnitude 450, and voltage pulse width time 420 (and other variables being equal), the configuring current characteristic 575B (with a state of higher value/property value of the resistive component 256 in RC circuit 295) has a more gradual initial slope 575B and reaches a lower maximum configuration current 545B during the voltage pulse width time 420, than the configuring current characteristic 575A.

Accordingly, it is noted that, with other variables held constant, the configuring current characteristics 575 change with the value of the resistive component level of the series-parallel RC circuit 295 of the selected, energized synapse connectors 250. In some embodiments, the capacitive component, typically 275, changes relatively little compared to the resistive component, typically 256, property level of the RC circuit 295 because the dominant total resistance of one or more of the PCMs in the synapse connector 250 (included in the total resistive component 256/property level) changes incrementally (increasing/decreasing) with each applied voltage pulse 215/400 in the pulse number of pulses 215, while the capacitive component does not.

As a result, by varying the shape, magnitudes 450/430, and/or durations 415/420/435 of the each applied pulse 215/400 in the pulse number and/or by selecting a particular configuring current characteristic 575 by selecting resistance 256 and capacitive 275 components of the RC circuit 295, the amount of current flowing through one or more of the PCMs in a selected, energized synapse connector 250 can be fashioned and controlled to produce a linear (or more linear) change in a measured property level (e.g., total resistance 256, resistance property level, of the PCM) of the synapse connector 250.

In some embodiments, the voltage pulse 215/400 is not modified because pulse characteristics (e.g., leading-edge 410 rise time 415; a maximum voltage or maximum voltage magnitude 450, pulse width time 420; and trailing-edge 430 fall time 435) are needed to meet criterion for incrementally changing properties of the PCM in the respective synapse connections 250. Therefore, in some embodiments, each of the voltage pulses 215/400 in the pulse number is identical.

In alternative embodiments, only one or more pulse characteristics (e.g., maximum voltage magnitude 450 and voltage pulse width time 420, etc.) are modified to incrementally change the PCM measured properties so that the incremental changes are proportional to the pulse number.

In still other alternative embodiments, both pulse characteristics and resistive and capacitive components of the RC circuit are adjusted/tuned so that the in incremental changes to PCM property(ies) are linearly proportional to the pulse number.

(It is noted that in some embodiments, many of the measure properties (e.g., those properties that are measured to indicate values like weightings 118 in neural networks) are identical, related to, and/or proportional to current flow, resistance, and/or conductance of the synapse connector 250 and by extension to PCM property levels like the (total) resistance/conductance of one or more of the PCMB within the synapse connector 250.)

Figure 6:
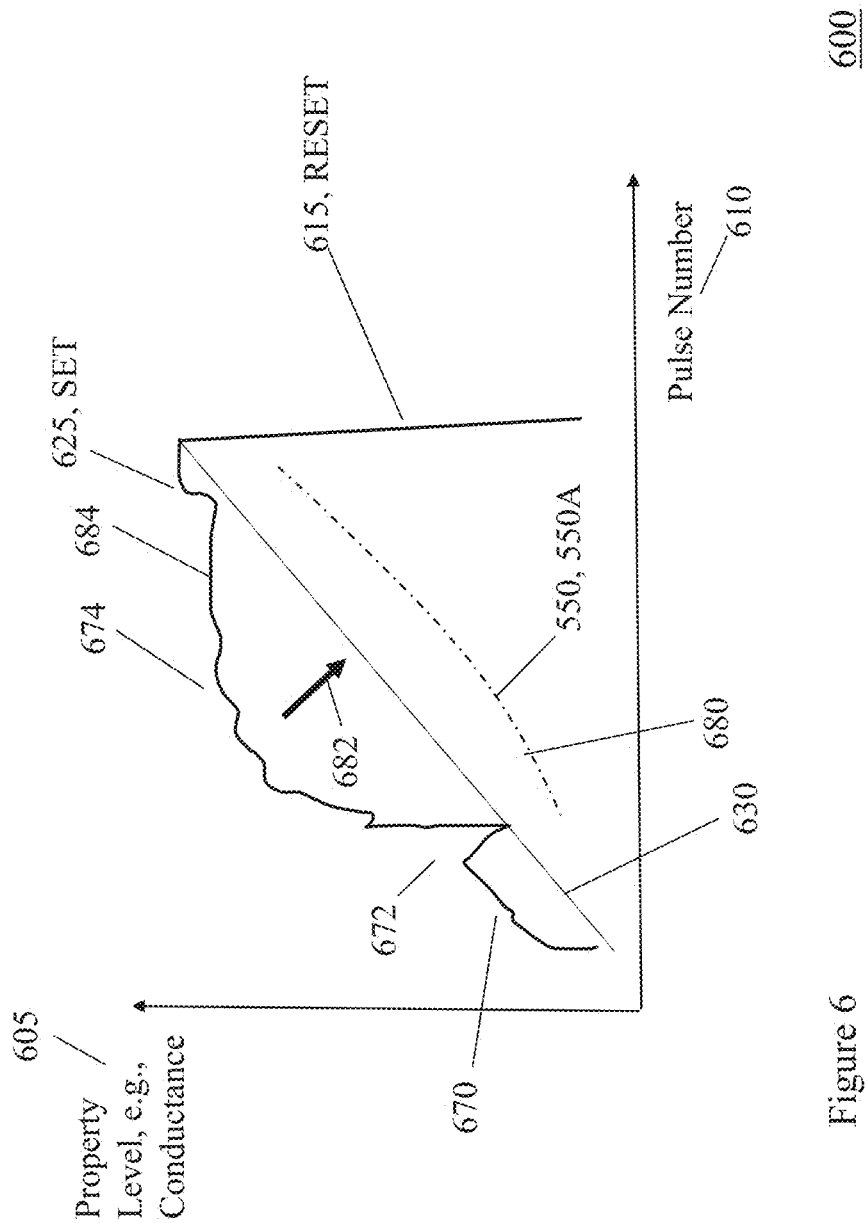
FIG. 6 is a graph showing a plot an actual PCM property level, e.g., total PCM conductance or PCM resistance, compared with a desired linear PCM property level as a function of pulse number, along with a configuring current applied to the PCM that makes the PCM property level approach linearity with respect to the pulse number.

FIG. 6 is a graph 600 showing a plot of a given property characteristic or property level 670, e.g., conductance, of one or more of the PCM properties 670 with respect to the pulse number 610 of pulses 400/215 applied to the synapse connector 250, where a configuring current 550/550A adjusts the property level (e.g., conductance) 670 to be more linear 630 with respect to pulse number 610.

In this non-limiting example, the property level (here total conductance of the PCM 256) 670 increases (increases conductance from low conductance to high conductance, i.e., goes from a HRS to LRS) as the pulse number 610 increases, during the Setting of the PCM 256.

In some embodiments, the PCM 256 is Reset 615 (from high conductance to low conductance or HRS) is a sharp transition, going through no intermediate states, but directly from the LRS to HRS in a short time, independent on the number of pulses 400/215 applied.

In some embodiments, the Reset 615 is accomplished by applying one or more higher voltage pulses, e.g., on the order of 3 volts for at least 60 ns (e.g., a Re-setting voltage threshold) to break the paths within the PCM 256 and Reset 615 the PCM 256.

Inspection of the graph 600 reveals that the actual property characteristic/level 670 (in this example, conductance) is increasing with pulse number 610, in an erratic and non-linear fashion 670. This non-linear and erratic property characteristic 670 creates data, e.g., weighting values 118, that are also erratic and non-linear. These non-linear data cause inaccuracies when used, e.g., in conjunction with providing constants, e.g., weighting values 118, in the neuromorphic network structure 100.

In this non-limiting example, the actual property charactedstic 670 (at low pulse number 610) increases erratically, with an initial steep slope 672. As the pulse number 610 increases, (the PCM 256 conductance level increases/resistance decreases, the slope tne conductance 674, although erratic, decreases 674, to become a flatter (or zero) slope 674 or even a negative slope 684, as more of the PCM 256 state(s) approach being SET 625 with the increasing number 610 and the conductance level 670 increases.

Therefore, to make the value of PCM 256 conductance level 605 approach linearity 630, the initial steep slope 672 of the actual property level 670 has to become less steep and the actual property level 670 at a higher pulse number 610 has to become more steep.

These problems are ameliorated or eliminated by combining the series/parallel RC circuit 295 in the synapse connector 250 to produce configurating currents 550 with a configuring current characteristic 575A/575B. The configuring current 550, e.g., as a component of currents 285A/285B, has the configuring current characteristic 575A/575B respectively that combine with actual property level characteristic 670 to produce a linear change 630 in PCM property level with respect to the applied pulse number 610.

For example, while the synapse connector 250 is being SET 625, the actual property level (the actual property level is the property level that occurs when the configuring current 550 is not applied), e.g., PCM 256 conductance (resistance) level, begins at a low conductance (high resistance, HRS) and increases (decreases) erratically with a generally steep slope 670/672.

However, since before Setting 625 any of the PCM states, the PCM in the synapse connector 250 has a high resistance (property) level (in the HRS, the conductance is low), the configuring currents 550, modified by the series-parallel RC circuit 256/276, will have configuring current characteristics 575 with a more gradual initial slope 575 that reaches a lower maximum configuration current 545B during the voltage pulse width time 420.

Therefore, as the configuration current 550 continues to flow (as a component of currents 285A/285B), the state (multiple states) of the PCM changes, incrementally adding conductance (lowering resistance) to the total PCM conductance, conductance property level. As the PCM conductance level increases (resistance decreases, going to a LRS), the slope of the configuring current characteristic 575/575A becomes steeper (approaching 575A) and the increments of adding conductance increase.

Accordingly, as the pulse number increases, the initial steeper slope 670/672 of the actual conductance level 670 is modified by the configuration current 550A to become more gradual (since the component of configuration current 550/550A is gradually increasing 680 initially with the number of pulses 610). Further, as the PCM state(s) approach being Set 625, the gradual slope 674 is modified to become steeper because of the shape of the configuring current characteristic 575A of the configuring current component 550 is increasing faster 684 as the conductance increases. Therefore, the change in PCM resistance/conductance property level 670 approaches 682 linearity 630 with respect to the pulse number 610.

In other words, the configuration current component 550 of the current 285/285A/285B has a configuration current 500 characteristic 575 that causes the non-linear (and erratic) actual property level characteristic 670 to change to be more linear with respect to applied pulse number 610.

Depending on the actual property level characteristic 670 of the PCM 256 with respect to pulse number 610, the actual resistance/conductance 256 level of the PCM with respect to applied pulse number 610, and the RC circuit capacitive 275 and resistive 256 components, the RC circuit 295 is designed to linearize 682 the PCM propert(ies) levels with respect to pulse number 610. These resistance and capacitance components 275/275A/275B/256 can be selected or "tuned" and placed at a given crossbar array 200 so that the series-parallel RC circuit 295 produces configuration current 550 (components) with configuration current characteristics 575 that causes the actual property level characteristic 670 of each synapse connector 250 to become 682 more linear 630 with respect, to the applied, increasing pulse numbers 610 while the PCM 256 is being Set 625.

Figure 7:
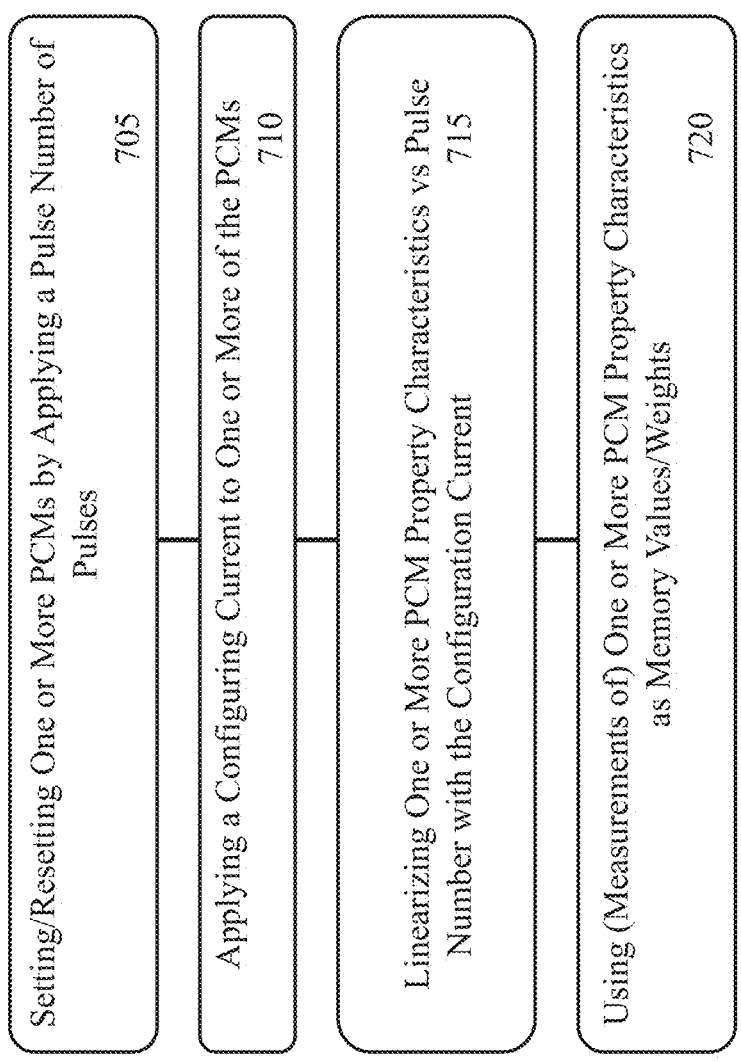
FIG. 7 is a flow chart showing the steps of an example operation process for operating a linear PCM memory device.

FIG. 7 is a flow chart showing the steps of an example operation process 700 for operating a linear PCM memory device 300.

The operation process 700 starts with step 705 by Setting 625 (and/or Resetting 615 in some embodiments) one or more PCMs 256 by applying a pulse number 610 of pulses to each of one or more of the PCMs.

In some embodiments, the pulses 400/215/500 are identical, e.g., in pulse (voltage) magnitude, duration, and shape.

In alternative embodiments, each of the pulses 400/215/500 can be different. For example, in some embodiments, the voltage pulse 400/215/500 magnitude, duration, and/or shape can be modified to be linearized (with respect to pulse number 610) one or more of the actual PCM property levels (e.g., conductance) 670 with respect to the pulse number 610. In addition to modify the RC circuit 295, the pulses 400/215/500 can be modified to linearize the actual PCM properties 670 of one or more individual PCMs 256 or sets 260 of PCMs 256, e.g., all PCMs connected to a single word line 270.

In step 710, a configuring current 550 is applied through each of one or more of the PCMs 256/synapse connector 250. As described above, the configuring current 550 has a configuring current characteristic 575, e.g., determined by the response to the voltage pulse 200/215/550 of the RC circuit 295 in the respective PCM 256/synapse connector 250.

In step 715, one or more of the actual property characteristics 670 of each synapse connector 250 becomes 682 more linear 630 with respect to applied, increasing pulse numbers 610 while the PCM 256/synapse connector 250 is being Set 625 (and/or Reset 615), i.e., due to the configuring current 550 flowing through the respective PCM 256/synapse connector 250. As discussed above, the configuring current 550 has a configuring current characteristic 575/575A/575B and can be a component of another current, e.g. 285.

Step 720 the value of one or more of the synapse 250 property levels is measured and used and/or stored as a value in one or more memories. For example, the controller 290 configures one or more of the connections, e.g., 220/221/222/254, to apply a voltage across one or more selected synapse connectors 250. The applied voltage causes a current to flow through the selected synapse connector. Knowing the applied voltage and resultant current, the associated output 225/226 can determine the resistance/conductivity, e.g., the property level of the selected synapse 250. The synapse 250 property level is then stored in an output memory 225/226/227 and/or the selected synapse 250 is used as a memory to store the property level. The property level values can also be stored in other memory locations, e.g., memory locations in a neural network 100 with one or more separate memories that store weighting values or in other non-volatile memory.

The synapse 250 property levels measured and/or outputted 225 can be any number of properties that can be measured and/or stored, e.g., 225, Set 625, and/or Reset 615. Non-limiting examples of these synapse 250 and/or PCM 256 property levels include: resistance, conductance, voltage, current, RC circuit 295 response, differential current, differential voltage, rise times, durations, voltage and/or current levels, etc.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, circuit configurations, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, neural networks, filnctional circuitry, etc. Systems and hardware incorporating the semiconductor devices and circuitry are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, circuits, and methods described with different terminology that perform substantially the same function, work in the substantial the same way, have substantially the same use, and/or perform the similar steps are contemplated as embodiments of this invention.

We claim:
1. A phase change memory (PCM) device comprising:
  a PCM, the PCM having one or more PCM properties, each PCM property having a plurality of PCM property states that each produce an incremental change to a property level of one or more of the respective PCM properties of the PCM in response to application of one or more of a pulse number of the voltage pulses;
  a resistance-capacitance (RC) circuit that produces a configuring current that flows through the PCM in response to one or more of the voltage pulses, the configuring current having a configuring current characteristic, wherein the configuring current modifies one or more of the incremental changes to one or more of the property levels so that the property level changes linearly with respect to the pulse number.

2. The device, as in claim 1, where one or more of the incremental changes is produced by Setting one or more of the PCM property states.

3. The device, as in claim 1, where one or more of the incremental changes is produced by Re-setting one or more of the PCM property states.

4. The device, as in claim 1, where all the PCM property states are Re-set at the same time by applying a voltage to the PCM above a Re-setting voltage threshold.

5. The device, as in claim 1, where the PCM properties include any one or more of the following: a PCM resistance, a PCM conductance, a duration, a rise-time, a fall-time, a current, a voltage, a differential current, and a differential voltage.

6. The device, as in claim 1, where the RC circuit has one or more resistive components and one or more capacitive components.

7. The device, as in claim 6, where the configuring current characteristic is modified by modifying one or more of the resistive components and capacitive components.

8. The device, as in claim 6, where the RC circuit resistive component includes one or more of the following: a resistance/conductance of the PCM in one or more of PCM states, one or more stray resistances, one or more external, individual resistors connected with a single PCM, one or more external common resistors connected in common with two or more of the PCM's.

9. The device, as in claim 6, where the RC circuit capacitive component includes one or more of the following: an external capacitor connected with one of the PCM's, one or more stray capacitors, one or more external, individual capacitors connected with a single PCM, one or more external common capacitors connected in common with a set of two or more of the PCM's.

10. The device, as in claim 6, where the RC circuit is tuned by modifying one or more of the resistive components and one or more of the capacitive components so that the configuring current modifies each of the one or more incremental changes differently to result in one or more of the property levels changing linearly with respect to the pulse number.

11. The device, as in claim 1, where configuring current characteristic modifies the incremental changes differently depending on the property level.

12. The device, as in claim 1, where each of the voltage pulses is identical.

13. The device, as in claim 1, where each of the voltage pulses has one or more of the voltage pulse characteristics, the voltage pulse characteristics including: one or more voltage magnitudes, one or more durations, a pulse shape, a leading edge, a leading-edge rise time, a maximum pulse voltage, a pulse width time/duration, a trailing-edge voltage magnitude, a trailing-edge, a trailing-edge fall time, and a trailing-edge fall time duration.

14. The device, as in claim 13, where one or more different voltage pulses has one or more pulse characteristics that is different from the pulse characteristics of other voltage pulses, wherein one or more of the different voltage pulses modifies one or more of the incremental changes to one or more of the property levels so that one or more of the property levels changes linearly with respect to the pulse number.

15. A memory array comprising:
one or more word lines, each of the word lines connected to an input capable of applying a pulse number of one or more voltage pulses to the respective word line through the respective input;
one or more sensing lines, one or more of the sensing lines connected to an output, each of the sensing line crossing one or more of the word lines at a synapse;
one or more synapse connectors, each synapse connector switchably connecting one of the word lines to one of the sensing lines at the respective synapse, the synapse connector further comprising:
a phase change memory (PCM), the PCM having one or more PCM properties, each PCM property having a plurality of PCM property states so that Setting and Re-setting each PCM property state produces an incremental change to a property level of one or more of the respective PCM properties of the PCM in response to one or more of the pulse number of voltage pulses;
a resistance-capacitance (RC) circuit that produces a configuring current that flows through the PCM in response to one or more of the voltage pukes, the configuring current having a configuring current characteristic, wherein the configuring current modifies one or more of the incremental changes to one or more of the property levels so that the property level changes linearly with respect to the pulse number.

16. The memory array, as in claim 15, where the RC circuit has a resistive component that includes one or more of the following: a resistance with a common resistive connection to a set of two or more PCMs and an individual resistance with an individual resistance connection to a single PCM.

17. The memory array, as in claim 15, where the RC circuit has a capacitive component that includes one or more of the following: a common capacitance with a common capacitance connection to a set of two or more PCMs and an individual capacitance with an individual capacitive connection to a single PCM.

18. The memory array, as in claim 15, where one or more of the PCM properties is used to represent one or more stored memory values, and the stored memory values used as weights in a neural network.

19. A method of using a memory array, the memory array having one or more word lines with each word line connected to an input, one or more sensing lines with each sensing line connected to an out and where each of the sensing line crosses one or more of the word lines at a synapse, the method comprising the steps of:
applying a pulse number of voltage pulses to one or more of the inputs to Set and Re-set one or more multiple phase change memory (PCM) states of one or more PCMs contained in one or more synapse connectors, each of the synapse connector switchably connecting one of the word lines to one of the sensing lines at the respective synapse, each of the voltage pulses producing an incremental change to a property level of one or more PCM properties of the PCM;
applying a configuring current flowing through the PCM, the configuring current produced by a resistance-capacitance (RC) circuit in response to one or more of the voltage pulses, the configuring current having a configuring current characteristic,
wherein the configuring current modifies one or more of the incremental changes to one or more of the property levels so that one or more of the property levels changes linearly with respect to the pulse number.

20. The method, of claim 19, where the PCM property of the PCM is a resistive conductance component of the RC circuit that modifies the configuring current characteristic.

* * * * *